(12) United States Patent
Kotani et al.

(10) Patent No.: US 11,751,373 B2
(45) Date of Patent: Sep. 5, 2023

(54) TRACING DEVICE

(71) Applicant: FUJI CORPORATION, Chiryu (JP)

(72) Inventors: Kazuya Kotani, Toyota (JP); Keiichi Ono, Anjo (JP); Mikiya Suzuki, Nishio (JP)

(73) Assignee: FUJI CORPORATION, Chiryu (JP)

(*) Notice: Subject to any disclaimer, the term of this patent is extended or adjusted under 35 U.S.C. 154(b) by 204 days.

(21) Appl. No.: 16/771,982

(22) PCT Filed: Dec. 28, 2017

(86) PCT No.: PCT/JP2017/047195
§ 371 (c)(1),
(2) Date: Jun. 11, 2020

(87) PCT Pub. No.: WO2019/130537
PCT Pub. Date: Jul. 4, 2019

(65) Prior Publication Data
US 2021/0144894 A1 May 13, 2021

(51) Int. Cl.
H05K 13/08 (2006.01)
G06T 7/00 (2017.01)

(52) U.S. Cl.
CPC ......... *H05K 13/084* (2018.08); *G06T 7/0004* (2013.01); *H05K 13/0812* (2018.08); *G06T 2207/30141* (2013.01); *H05K 13/083* (2018.08)

(58) Field of Classification Search
CPC ............. H05K 13/084; H05K 13/0812; H05K 13/083; G06T 7/0004; G06T 2207/30141
USPC ........................................................ 382/141
See application file for complete search history.

(56) References Cited

U.S. PATENT DOCUMENTS

| | | | |
|---|---|---|---|
| 8,885,918 B2* | 11/2014 | Amanullah | G01N 21/9501 382/141 |
| 2007/0023716 A1* | 2/2007 | van der Burgt | G06T 7/001 250/559.29 |
| 2010/0189339 A1* | 7/2010 | Amanullah | G06T 7/001 382/145 |

(Continued)

FOREIGN PATENT DOCUMENTS

| | | |
|---|---|---|
| EP | 3 541 161 A1 | 9/2019 |
| JP | 8-321700 A | 12/1996 |

(Continued)

OTHER PUBLICATIONS

International Search Report dated Apr. 3, 2018 in PCT/JP2017/047195 filed Dec. 28, 2017, 2 pages.

*Primary Examiner* — Marnie A Matt

(74) *Attorney, Agent, or Firm* — Oblon, McClelland, Maier & Neustadt, L.L.P.

(57) ABSTRACT

A tracing device includes an appropriateness determination section configured to determine whether an image processing, which is executed in a production process of a board product by a board work machine, satisfies an appropriateness condition indicating reliability of a result of the image processing when the result of the image processing stays within a permissible range in which the result of the image processing is determined normal and an information management section configured to record image data used in the image processing as traceability information according to the result of the determination made by the appropriateness condition determination section.

14 Claims, 6 Drawing Sheets

(56) References Cited

U.S. PATENT DOCUMENTS

| | | | | |
|---|---|---|---|---|
| 2010/0290664 | A1* | 11/2010 | Wang | G06T 7/0006 |
| | | | | 382/100 |
| 2012/0293648 | A1* | 11/2012 | Nakayama | H05K 13/0812 |
| | | | | 348/87 |
| 2017/0252880 | A1* | 9/2017 | Okada | H05K 13/0404 |
| 2019/0174662 | A1* | 6/2019 | Ninomiya | H05K 13/04 |
| 2019/0274238 | A1* | 9/2019 | Sugiyama | H05K 13/083 |
| 2021/0233226 | A1* | 7/2021 | Sugiyama | G05B 19/418 |

FOREIGN PATENT DOCUMENTS

| | | | | |
|---|---|---|---|---|
| JP | 11-258178 A | | 9/1999 | |
| JP | 2008-197772 A | | 8/2008 | |
| JP | 2012-169394 A | | 9/2012 | |
| JP | 2013-21074 A | | 1/2013 | |
| JP | 2015-133349 A | | 7/2015 | |
| JP | WO-2015181905 | * | 12/2015 | H05K 13/041 |
| KR | 20160003608 A | * | 1/2016 | G01N 21/8806 |

* cited by examiner

Fig. 4

[TABLE 1] RESULTS OF IMAGE PROCESSING (STATE RECOGNITION PROCESSING)

| EXECUTION TIME OF IMAGE PROCESSING | PROCESSING RESULTS | | REQUIRED TIME | NORMALITY OF IMAGE PROCESSING | RELIABILITY OF PROCESSING RESULTS |
|---|---|---|---|---|---|
| | COORDINATES | STATES | | | |
| D1:H1:M1:S01 | Xa1, Ya1 | $\theta 11$ | Ta1 | YES | YES |
| D1:H1:M1:S02 | Xa2, Ya2 | $\theta 12$ | Ta2 | YES | YES |
| D1:H1:M1:S03 | Xa3, Ya3 | $\theta 13$ | Ta3 | YES | YES |
| ⋮ | ⋮ | ⋮ | ⋮ | ⋮ | ⋮ |
| D1:H1:M1:S11 | Xb1, Yb1 | $\theta 21$ | Tb1 | NO | NO |
| D1:H1:M1:S12 | Xb1, Yb1 | $\theta 21$ | Tb2 | YES | NO |
| D1:H1:M1:S13 | Xb1, Yb1 | $\theta 21$ | Tb3 | YES | YES |
| ⋮ | ⋮ | ⋮ | ⋮ | ⋮ | ⋮ |

[TABLE 2] LOOKUP TABLE BETWEEN PERMISSIBLE RANGE AND APPROPRIATENESS CONDITION

| | IMAGE PROCESSING TYPE | PERMISSIBLE RANGE | APPROPRIATE RANGE | |
|---|---|---|---|---|
| | | | SCHEDULED RANGE | STATISCAL VALUE |
| BOARD | POSITIONING | X AXIS: Xa1−Xa10<br>Y AXIS: Ya1−Ya10<br>ANGLE: $\theta$a1−$\theta$a10<br>REQUIRED TIME: 0−Ta10 | X AXIS: Xa1−Xa10<br>Y AXIS: Ya1−Ya10<br>ANGLE: $\theta$a1−$\theta$a10<br>REQUIRED TIME: 0−Ta10 | X AXIS: XaAve±N<br>Y AXIS: YaAve±N<br>ANGLE: $\theta$aAve±N<br>REQUIRED TIME: TaAve±N |
| | MARK INTERVAL | | | |
| | CONVEYANCE | | | |
| | ⋮ | | | |
| COMPONENT | SUPPLY STATE | X AXIS: Xb1−Xb10<br>Y AXIS: Yb1−Yb10<br>ANGLE: $\theta$b1−$\theta$b10<br>REQUIRED TIME: 0−Tb10 | X AXIS: Xb4−Xb6<br>Y AXIS: Yb4−Yb6<br>ANGLE: $\theta$b4−$\theta$b6<br>REQUIRED TIME: Tb4−Tb6 | X AXIS: XbAve±N<br>Y AXIS: YbAve±N<br>ANGLE: $\theta$bAve±N<br>REQUIRED TIME: TbAve±N |
| | HELD STATE | | | |
| | 3D SHAPE | | | |
| | COPLANARITY | ⋯ | ⋯ | ⋯ |
| | LEAD SECTION HEIGHT | ⋯ | ⋯ | ⋯ |
| | ⋮ | | | |
| IDENTIFICATION CODE | BOARD | ⋯ | ⋯ | ⋯ |
| | TRAY | ⋯ | ⋯ | ⋯ |
| | PICKUP NOZZLE | ⋯ | ⋯ | ⋯ |
| | ⋮ | | | |

Fig. 6

| IMAGE PROCESSING | NORMALITY OF PROCESSING RESULT | APPROPRIATENESS OF IMAGE PROCESSING | NECESSITY OF RECORDING OF TRACEABILITY INFORMATION | NECESSITY OF EXECUTION OF ERROR PROCESSING |
|---|---|---|---|---|
| PRIMARY IMAGE PROCESSING (RECORD TEMPORARILY) | YES | YES | (RECORD TEMPORARILY) | NO |
| | YES | NO | YES(*1) | NO |
| | NO | NO | YES(*1) | YES |
| SECONDARY IMAGE PROCESSING (RECORD TEMPORARILY) | YES | YES | (RECORD TEMPORARILY) | NO |
| | YES | NO | YES(*2) | NO |
| | NO | NO | YES(*2) | YES |

*1: PRIMARY IMAGE DATA AND PARAMETERS OF PRIMARY IMAGE PROCESSING ARE RECORDING TARGETS.
*2: PRIMARY IMAGE DATA AND PARAMETERS OF PRIMARY IMAGE PROCESSING AND SECONDARY IMAGE DATA AND PARAMETERS OF SECONDARY IMAGE PROCESSING ARE RECORDING TARGETS.

Fig. 7

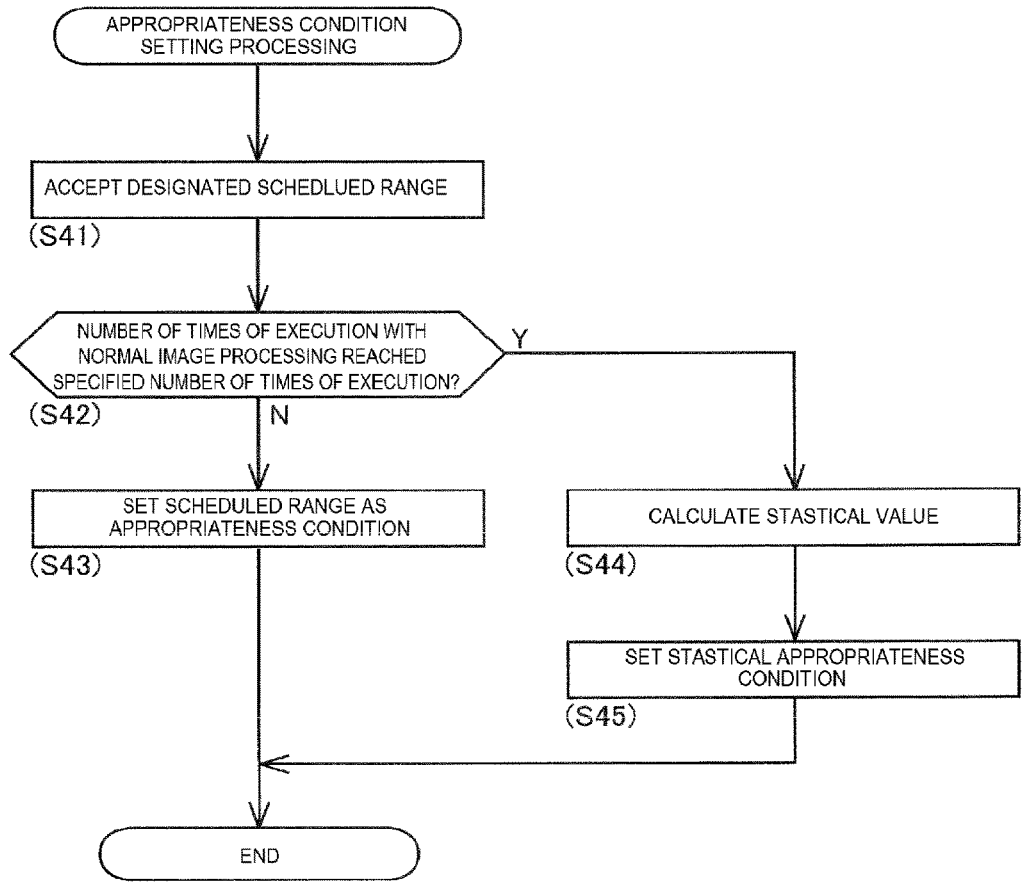

TRACING DEVICE

TECHNICAL FIELD

The present application relates to a tracing device.

BACKGROUND ART

In a production process of producing board products, a board work machine executes an image processing so as to improve the accuracy and reliability of production work being carried out. A tracing device applied to a board work machine records traceability information so as to trace a production process that the board work machine carries out. Patent Literature 1 discloses a configuration in which image data used for image processing is recorded as traceability information when abnormality is detected while executing a production process.

PATENT LITERATURE

Patent Literature 1: JP-A-2012-169394

BRIEF SUMMARY

Technical Problem

However, in the event that an image processing that should be determined abnormal is erroneously determined normal due to various causes, image data used in that image processing does not constitute target data to be recorded by the tracing device. Therefore, even though abnormality is detected in a post-step such as an inspection step, there have been cases where the production process cannot be traced. In addition, in a configuration in which all image data is recorded irrespective of the results of an image processing, it is not easy to locate a specific image processing constituting a cause for abnormality based on the large amount of image data so recorded.

An object of the present description is to provide a tracing device that can improve the traceability of a production process of a board work machine.

Solution to Problem

According to the present description, there is provided a tracing device comprising an appropriateness determination section configured to determine whether an image processing, which is executed in a production process of a board product by a board work machine, satisfies an appropriateness condition indicating reliability of a result of the image processing when the result of the image processing stays within a permissible range in which the result of the image processing is determined normal, and an information management section configured to record image data used in the image processing as traceability information according to a result of the determination by the appropriateness condition determination section.

ADVANTAGEOUS EFFECTS

According to the configuration described above, in the event that the image processing does not have a certain degree of reliability even though the result of the image processing is normal, the image data used in the image processing is recorded as the traceability information. That is, the tracing device regards the image data suspected of being abnormal in the image processing as a recording target. As a result, in the event that an image processing that is erroneously determined normal in an image processing step is detected as abnormal in a post step, the image processing causing the abnormality can be specified based on the image data recorded as the traceability information. Thus, the traceability for a production process carried out by a component mounting machine can be improved.

BRIEF DESCRIPTION OF DRAWINGS

FIG. 4 shows a chart showing results of image processing and a chart showing a correlation between permissible ranges of image processing and appropriateness conditions.

FIG. 6 is a chart showing a correlation between image processing, results of appropriateness determinations, and necessities of image data recording, FIG. 7 is a flowchart showing a setting process of an appropriateness condition.

DESCRIPTION OF EMBODIMENTS

1. Embodiment

Hereinafter, referring to drawings, an embodiment of a tracing device will be described. A tracing device records traceability information so as to trace a production process carried out by a board work machine. In this embodiment, a mode will be described in which the tracing device is applied to a component mounting machine as the board work machine.

1-1. Configuration of Component Mounting Machine 1

Figure 1:
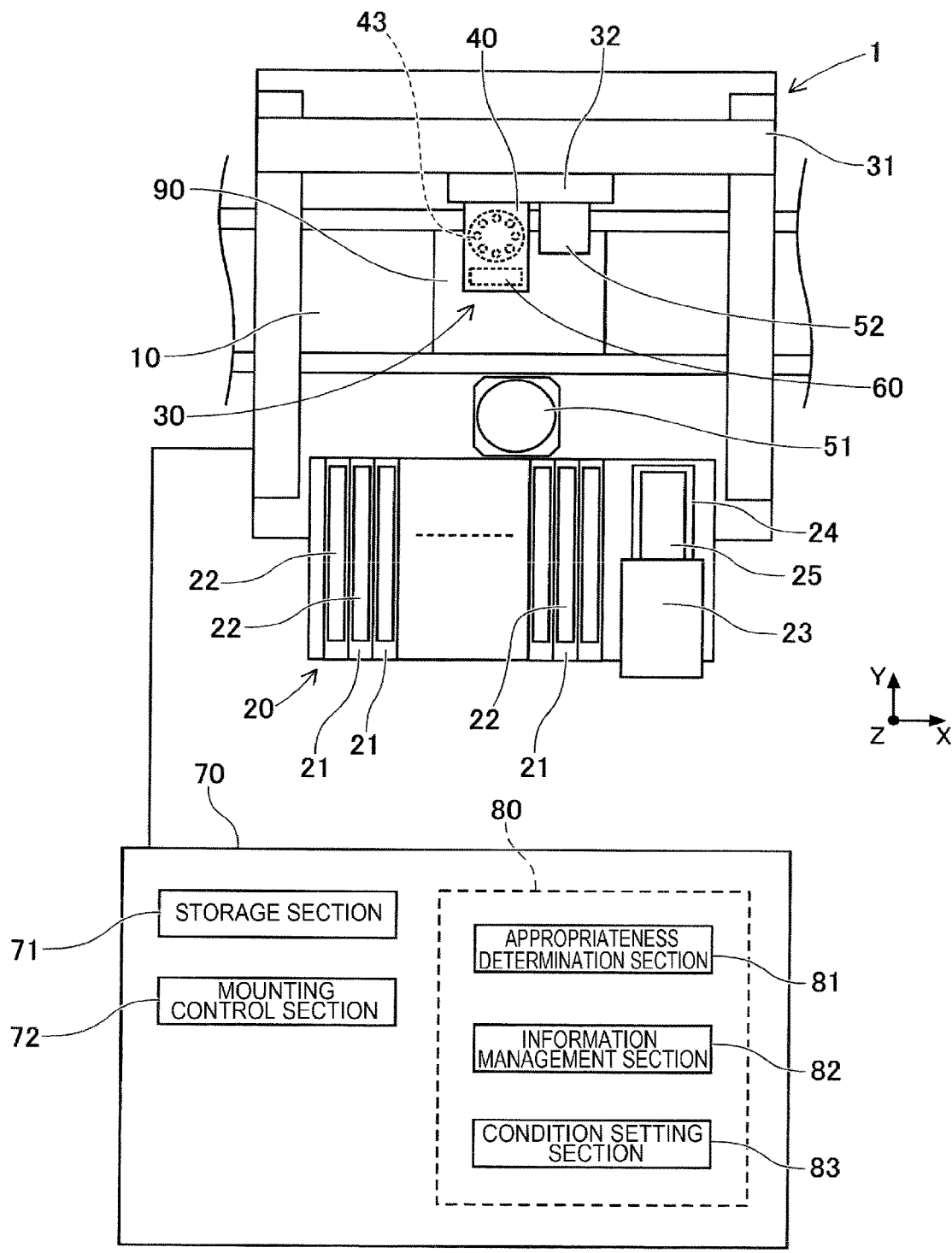
FIG. 1 is a schematic diagram showing a component mounting machine to which a tracing device of an embodiment of the present description is applied.

Component mounting machine 1 produces a board product by mounting multiple components P (refer to FIG. 2) on circuit board (hereinafter, referred to simply as "board") 90. As shown in FIG. 1, component mounting machine 1 includes board conveyance device 10, component supply device 20, component transfer device 30, component camera 51, board camera 52, head camera unit 60, and control device 70.

Board conveyance device 10 is made up of a belt conveyor, a positioning device, and the like. Board conveyance device 10 executes a conveyance process of conveying board 90 sequentially in a conveyance direction and a positioning process of positioning board 90 in a predetermined position inside component mounting machine 1. Board conveyance device 10 positions board 90 inside component mounting machine 1 after board 90 is transferred into component mounting machine 1 before execution of a production process. Board conveyance device 10 conveys board 90 to the outside of component mounting machine 1 after component mounting machine 1 ends the production process of mounting the components on board 90.

Component supply device 20 supplies components to be mounted on board 90. Component supply device 20 includes multiple feeders 22 set in multiple slots 21. Feeder 22 feeds and moves a carrier tape that stores a number of components so that the components can be picked up. In addition, component supply device 20 supplies, for example, relatively large components by arranging them on tray 25 rested on pallet 24. Component supply device 20 stores multiple pallets 24 in storage rack 23 and supplies components by pulling predetermined pallet 24 out of storage rack 23 in accordance with a mounting process.

Component transfer device 30 transfers a component supplied by component supply device 20 to a predetermined mounting position on board 90 that has been conveyed into component mounting machine 1 by board conveyance device 10. Head driving device 31 of component transfer device 30 moves moving plate 32 in a horizontal direction (an X-axis direction and a Y-axis direction) by a translation mechanism. Mounting head 40 is fixed to moving plate 32 in an exchangeable fashion by a clamp member, not shown.

Figure 2:
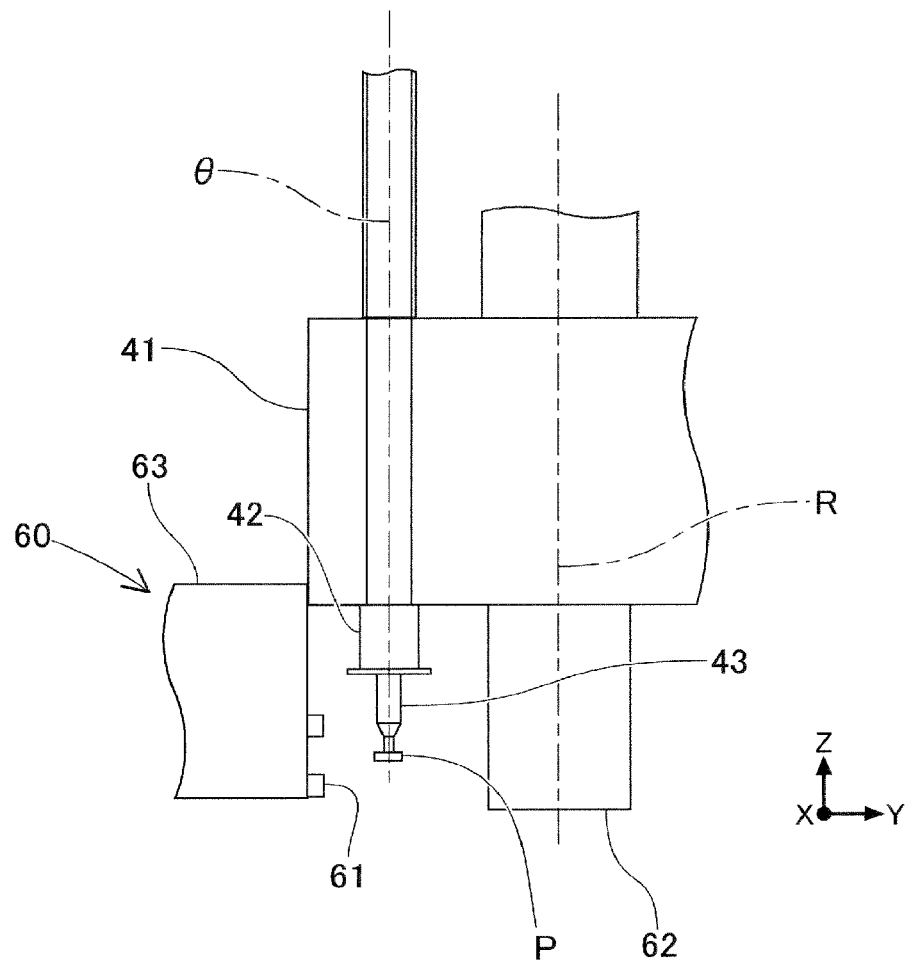
FIG. 2 is a side view showing a part of a mounting head and a head camera unit in an enlarged fashion.

As shown in FIG. 2, mounting head 40 has rotary head 41 that can rotate around an R axis parallel to a Z axis. Rotary head 41 supports multiple holders 42, which are disposed at equal intervals in a circumferential direction on a circumference that is concentric with the R axis, in such a manner as to slide in a Z-axis direction. Pickup nozzles 43 are attached individually to lower end portions of multiple holders 42 in an exchangeable fashion. Mounting head 40 raises and lowers integrally holders 42 and pickup nozzles 43 and rotates holders 42 and pickup nozzles 43 around θ-axis, being parallel to the Z axis, which passes through the center of holder 42.

A negative pressure air is supplied from a negative pressure air supply source to each of multiple pickup nozzles 43 by way of corresponding holders 42. As a result, each of multiple pickup nozzles 43 sucks and holds component P at a tip portion thereof. The negative pressure air supply source is made up of an air pump or the like provided, for example, in an interior of mounting head 40. As described above, mounting head 40 holds component P supplied by component supply device 20. Mounting head 40 controls an angle at which pickup nozzle 43 for holding component P is rotated around the θ-axis and a height of thereof in the Z-axis direction.

Component camera 51, board camera 52, and head camera unit 60 are a digital imaging device having an image pickup device such as CMOS. Component camera 51, board camera 52, and head camera unit 60 perform imaging based on a control signal by control device 70 with which they are connected for communication and sends image data acquired through the imaging so performed to control device 70.

Component camera 51 is fixed to a base of component mounting machine 1 in such a manner that an optical axis thereof is directed upwards in the Z-axis direction, as shown in FIG. 1. Component camera 51 can image a component held by pickup nozzle 43 of mounting head 40 from below. Board camera 52 is provided on moving plate 32 of component transfer device 30 in such a manner that an optical axis thereof is directed downwards in the Z-axis direction. Board camera 52 can image board 90 from above.

Head camera unit 60 is provided on mounting head 40 as shown in FIG. 2 and moves together with mounting head 40 as moving plate 32 moves. Head camera unit 60 images pickup nozzles 43 attached to mounting head 40 and components P held by pickup nozzles 43 from a side. Image data acquired through imaging by head camera unit 60 is image processed in control deice 70 for use for various inspections of components P. The various inspections include inspections of a coplanarity of leads, a height of leads and the like when components P are, for example, lead components.

As shown in FIG. 2, head camera unit 60 includes light source 61, reflection member 62, and camera device 63. Light source 61 is made up of multiple light emitting diodes emitting light in a central direction (an R-axis direction) of rotary head 41. Reflection member 62 has a cylindrical shape and is disposed at a lower end of rotary head 41 so as to be concentric with the R axis. Reflection member 62 reflects light shone by light source 61 on a cylindrical outer circumferential surface thereof.

Camera device 63 images holder 42, pickup nozzle 43, and component P, onto which light is shone by light source 61 and reflection member 62. Image data acquired through imaging by head camera unit 60 is generated in such a manner that a range where holder 42, pickup nozzle 43, and component P exist is shadowed by reflection member 62 constituting a background thereof. A contrast between the image data and the background is enhanced by executing an image processing such as a binarization or the like in control device 70.

Control device 70 is mainly comprised of CPU, various memories, and a control circuit, Control device 70 executes a mounting process of mounting components on board 90 as a production process. Control device 70 communicates with an outside host computer and controls an operation of component transfer device 30 or the like based on various pieces of information. As shown in FIG. 1, control device 70 has storage section 71, mounting control section 72, and tracing device 80.

Storage section 71 is made up of an optical drive device such as a hard disk device, a flash memory, or the like. This storage section 71 stores a control program for operating component mounting machine 1, image data sent out from component camera 51, board camera 52, and head camera unit 60 to control device 70, traceability information recorded by tracing deice 80, which will be described later, and the like. Tracing device 80 will be described in detail later.

Mounting control section 72 executes a mounting process of mounting component P held by pickup nozzle 43 on board 90. More specifically speaking, in the mounting process, information outputted from multiple sensors of various types provided in component mounting machine 1, results of image processing, and the like are inputted into mounting control section 72. Then, mounting control section 72 sends out a control signal to component transfer device 30 or the like based on the control program stored in storage section 71, the information from the sensors of various types, and the results of the image processing. As a result, positions and angles of multiple pickup nozzles 43 supported on mounting head 40 are controlled.

1-2. Outline and Detailed Configuration of Tracing Device 80

Tracing device 80 records traceability information so as to trace the mounting process carried out by component mounting machine 1. The "traceability information" is information used to specify a cause for such abnormality that a component or components are not properly mounted on a board when the abnormality is detected during or after execution of a mounting process by tracing steps involved in the mounting process. In this embodiment, traceability information includes image data used for various image processing and parameters used for the image processing.

In this embodiment, as shown in FIG. 1, tracing device 80 includes appropriateness determination section 81, information management section 82, and condition setting section 83. When the result of an image processing executed in a mounting process carried out by component mounting machine 1 stays within a permissible range where the result is determined normal, appropriateness determination section 81 determines whether the image processing satisfies an appropriateness condition indicating the reliability of the result of the image processing. Here, the "reliability of the result of the image processing" corresponds to a degree at which the result of the image processing that is determined to be normal is truly normal.

In other words, in the case that the result of the image processing has no reliability of a certain degree, there is a possibility that appropriateness determination section 81 determines erroneously that the result of the image processing is normal. On the other hand, in the case that the result of the image processing has a certain degree of reliability based on the fact, for example, that the result of the image processing approximates to an ideal value, falls within an estimated range, or the like, the result of the image processing that is determined normal is considered to be certain sufficiently. Appropriateness determination section 81 determines whether the image processing is appropriate by use of an appropriateness condition as an index for determining whether the result of the image processing has a certain degree of reliability.

Information management section 82 records the image data used for the image processing as traceability information in accordance with the result of the determination made by appropriateness determination section 81. In this embodiment, information management section 82 records the image data used for the image processing as traceability information in the case that appropriateness determination section 81 determines that the image processing does not satisfy the appropriateness condition in addition to the case where the result of the image processing is abnormal. Further, information management section 82 records, as traceability information, the parameters used in the image processing in association with the image data.

For example, in the case that the result of the image processing is a coordinate value of a component, the appropriateness condition can be set within a scheduled range of the coordinate value at which the component is situated in a permissible range where the result of the image processing is determined normal. That is, in the event that the coordinate value of the component that is acquired as a result of the image processing falls within the scheduled range, appropriateness determination section 81 determines that the image processing that calculates the coordinate value satisfies the appropriateness condition and, hence, that the result of the image processing has a certain degree of reliability.

In addition to the condition that is compared with the result of the image processing as described above, a condition that evaluates the progress of the image processing (for example, a required time of the image processing) and a condition that is compared with the results of image processing that are carried out in post steps to be executed in series can be set as the appropriateness condition. In the case that the same image processing has already been executed multiple times, in addition to setting an arbitrary value, a statistical value may be set for the appropriateness conditions of the types described above.

According to the configuration described above, the image data, which is the traceability information, includes parameters (the types of the image processing, the types of the steps, the execution order of the steps, the set values for the steps, and the like) indicating the types of the image processing that are carried out on the image data. As a result, in tracing the steps in the mounting process based on the traceability information, the appropriateness of the image processing itself can be determined by reproducing the image data resulting after the final image processing is executed. As a result, the image processing causing the abnormality can be specified.

Condition setting section 83 receives an input on the appropriateness condition inputted by an operator who manages the production process. Further, in the this embodiment, condition setting section 83 sets a statistical appropriateness condition based on the results of the image processing that is executed multiple times. Specifically speaking, condition setting section 83 sets a statistical appropriateness condition based on an average value, a median, or a most frequently occurring value in the results of the image processing executed multiple times. That is, for example, in the event that the image processing is executed to such an extent that the statistical value becomes significant, condition setting section 83 automatically sets a range that is estimated based on the results of the image processing.

Condition setting section 83 may switch the appropriateness conditions in accordance with the significance of the statistical appropriateness condition. That is, condition setting section 83 receives the scheduled range designated by the operator and sets the appropriateness condition, in accordance with the number of times of executing the image processing, which is made by switching the appropriateness condition based on the designated scheduled range and the statistical appropriateness condition. According to the configuration described above, firstly, condition setting section 83 adopts the scheduled range designated by the operator as an initial value for an appropriateness determination. Then, determining that the statistical appropriateness condition is significant at a point in time when the number of times of executing the normal image processing exceeds a predetermined number of times, condition setting section 83 adopts the statistical appropriateness condition for an appropriateness determination.

1-3. Mounting Process by Component Mounting Machine 1

Figure 3:
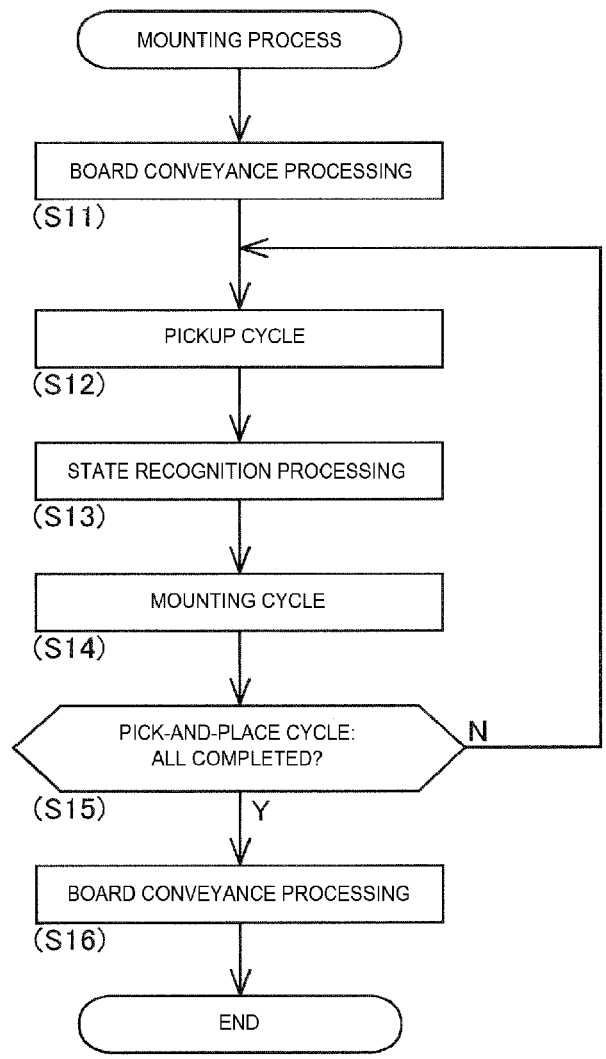
FIG. 3 is a flowchart showing a production process carried out by the component mounting machine.

Referring to FIG. 3, a mounting process carried out by component mounting machine 1 will be described. In the mounting process, mounting control section 72 of control device 70 firstly executes a conveyance processing of conveying board 90 into component mounting machine 1 (step 11 (hereinafter, a "step" will be referred to as "S")). In the conveyance processing of board 90, board conveyance device 10 conveys board 90 into the interior of component mounting machine 1 and positions board 90 in the predetermined position in component mounting machine 1.

Next, mounting control section 72 executes a pickup cycle causing sequentially multiple pickup nozzles 43 to pick up components P (S12). More specifically speaking, mounting control section 72 moves mounting head 40 to a position lying above feeder 22 or tray 25 from which component P of a predetermined type is supplied in component supply device 20. Then, mounting control section 72 lowers pickup nozzle 43 to pick up component P and thereafter raises back pickup nozzle 43 in question. In the pickup cycle, mounting head 40 moves so repeatedly and pickup nozzle 43 is lowered and raised back repeatedly, whereby multiple components P are held by multiple pickup nozzles 43 individually.

Subsequently, mounting control section 72 executes a state recognition processing of recognizing a held state of component P held by each of multiple pickup nozzles 43 (S13). More specifically speaking, mounting control section 72 moves mounting head 40 to a position lying above component camera 51 and sends out an imaging command to component camera 51. Mounting control section 72 image processes image data acquired through imaging by component camera 51 and recognizes postures (positions and angles) of components P held individually by multiple pickup nozzles 43.

Then, mounting control section 72 executes a mounting cycle of causing sequentially multiple pickup nozzles 43 to mount components P on board 90 (S14). More specifically speaking, mounting control section 72 moves mounting head 40 to a position lying above a predetermined mounting position on board 90. At this time, mounting control section 72 corrects the position and angle of pickup nozzle 43 based on the results of the state recognition processing (S13). Then, mounting control section 72 lowers pickup nozzle 43, causing it to mount component P on board 90, and thereafter raises back pickup nozzle 43. In the mounting cycle, mounting head 40 is moved so repeatedly, and pickup nozzles 43 are lowered and raised so repeatedly, whereby multiple components P are mounted individually on board 90.

Control device 70 determines whether all components P to be mounted on board 90 currently staying in component mounting machine 1 have been mounted (S15) and executes the pick-and-place cycle (S12 to S14) until all such components P are mounted on board 90. When all such components P have been mounted on board 90 (S15: Yes), mounting control section 72 executes a conveyance processing of conveying board 90 out of component mounting machine (S16). In the conveyance processing of conveying board 90 out of component mounting machine 1, board conveyance device 10 releases board 90 from the positioned state and then conveys board 90 out of component mounting machine 1.

1-4. Image Processing in Mounting Process

While component mounting machine 1 is executing the mounting process, various image processing including the component state recognition process (S13) are executed. Here, the "image processing" includes one processing such as a binarization or edge processing and also includes a processing (for example, the state recognition processing of component P (S13), an inspection processing) of combining the binarization and edge processing to output a state of a constituent component of a board product as a result of the combination, as well as an identification code reading processing. Here, the "constituent component" of the board product includes board 90, a cream solder printed on board 90, and component P mounted on board 90.

The state recognition processing, which is executed while component mounting machine 1 is executing the mounting process, includes not only the component state recognition processing (S13) described above but also a processing of recognizing states of various target objects (component P, board 90, and the like). In addition, the various states recognition processing, the inspection processing, and the identification code reading processing can be executed in parallel with the pickup cycle (S12), the mounting processing (S14), and the board conveyance processing (S11, S16).

Further, in addition to image data acquired through imaging by component camera 51, image data acquired through imaging by board camera 52, head camera unit 60, and a camera, not shown, provided exclusively for this purpose can be used for the various states recognition processing, the inspection processing, and the identification code reading processing.

1-4-1 States Recognition Processing and Inspection Processing of Component P

In the state recognition processing (S13) targeting component P, the presence of component P, a coordinate value of a center of component P with respect to mounting head 40, and an angle of component P with respect to mounting head 40 are outputted based on image data acquired through imaging component P held by pickup nozzle 43 of mounting head 40 from below by component camera 51 as the result of the state recognition processing. When the state recognition processing or the inspection processing, which will be described below, is executed as the image processing, information management section 82 records times at which the image processing is executed, results of the image processing so executed, required times of the processing, normality of the image processing, and reliability of the results of the processing, as shown in Table 1 of FIG. 4.

Additionally, the state recognition processing targeting component P may include a processing of recognizing a state of component P supplied by feeder 22 or tray 25 for pickup. For example, depending upon a set state of feeder 22 in slot 21, the position of component P supplied may deviate from the ideal position. For this reason, for example, in the pickup cycle (S12), after feeder 22 is set in slot 21 and before component P supplied from feeder 22 is picked up, the state recognition processing described above is executed. In recognizing the state of component P supplied from feeder 22 or tray 25, however, the state recognition processing is carried out based on image data acquired through imaging component P from above not by component camera 51 but by board camera 52.

Further, for example, when component P is picked up based on a specific location on component P such as a light emitting section of an LED component, in the pickup cycle (S12), the state recognition processing described above is executed in order to recognize the position of the specific location of component P. To describe this in detail, using board camera 52 provided on moving plate 32 to image component P, control device 70 causes board camera 52 to image a component supplied by component supply device 20. Then, image data acquired through the imaging carried out as described above is image processed, whereby a coordinate value and an angle of component P in a supplied state and a coordinate value of the specific location of component P are outputted as the results of the image processing so carried out.

In addition, the state recognition processing of component P that is carried out based on image data acquired through imaging by head camera unit 60 includes a recognition of a three-dimensional shape of component P and various inspections intended for component P (a coplanarity inspection a height inspection of a lead section, and the like) in the case of component P being a lead component. Here, in this embodiment, the "image processing" may include a primary image processing (for example, the recognition processing) using primary image data and a secondary image processing (for example, various inspection processing) using secondary image data, the primary image data and the secondary image data being acquired by imaging the same target using different cameras.

1-4-2. State Recognition Processing and Inspection Processing of Board 90

The state recognition processing targeting board 90, which is a constituent component of a board product, includes, for example, a processing of recognizing a state of board 90 positioned by board conveyance device 10. Specifically speaking, in the conveyance processing (S11) of conveying board 90 into component mounting machine 1, control device 70 processes image data acquired by causing board camera 52 to image multiple reference marks affixed to an upper surface of board 90 to thereby acquire a position and an angle of board 90. Control device 70 controls the operation of component transfer device 30 based on the results of the state recognition processing described above.

In addition, the state recognition processing targeting board 90 includes, for example, a processing of recognizing a state of board 90 which is being conveyed into component mounting machine 1. Specifically speaking, in the board conveyance processing (S11), control device 70 processes image data acquired by causing board camera 52 to image an end portion of board 90 in the X-axis direction to thereby recognize a current position of board 90 which is being conveyed into or out of component mounting machine 1. Control device 70 controls the operation of board conveyance device 10 based on the results of the state recognition processing described above.

Further, having executed the state recognition processing of recognizing the state of board 90 using the multiple reference marks as described above as a primary image processing, control device 70 executes a pitch inspection of inspecting whether the intervals between the multiple reference marks fall within a specified range as a secondary image processing. As a result, for example, in the event that through holes in board 90 are recognized erroneously as reference marks, intervals of the multiple reference marks, which are actually the through holes, do not fall within the specified range, whereby it can be recognized that the reliability of the results of the state recognition processing targeting board 90 is low (that is, that the secondary image processing does not have a certain degree of reliability).

1-4-3. Identification Code Reading Processing

The image processing executed by control device 70 includes a processing of reading identification codes affixed to board 90, tray 25 for supplying components P, pickup nozzles 43, and the like (hereinafter, referred to as a "code reading processing"). As the identification codes, for example, an identification sign (ID), which is unique information of a target object such as board 90, is recorded in the form of a character string. A bar code, a two-dimensional code in which multiple cells are aligned, or the like can be adopted as the identification code.

The identification codes are affixed to or directly printed on edge portions of board 90 and tray 25, flange sections of pickup nozzles 43, and the like. Control device 70 executes a code reading processing when new board 90 is conveyed into component mounting machine 1, trays 25 are exchanged inside or outside storage rack 23, pickup nozzles 43 are automatically exchanged, and the like.

Specifically speaking, control device 70 uses board camera 52 provided on moving plate 32 to image the identification codes, causing board camera 52 to image the identification codes affixed to the target objects. Then, image data acquired though imaging by board camera 52 is image processed, whereby the identification signs recorded in the identification codes are outputted as the results of the image processing so carried out. When the code reading processing described above is executed, as when the state recognition processing and the inspection processing are executed, information management section 82 records image processing execution times, image processing results (a read character string, and the like), required times of image processing, normality of the image processing, and reliability of results of image processing.

1-5. Recording Processing of Traceability Information by Tracing Device 80

Referring to FIGS. 4 to 7, a relationship between various types of image processing executed by control device 70 and recording processing of traceability information by tracing device 80 will be described. Here, the state recognition processing of component P using component camera 51 is executed as a primary image processing, and the inspection processing of component P using head camera unit 60 is executed as a secondary image processing.

Figure 5:
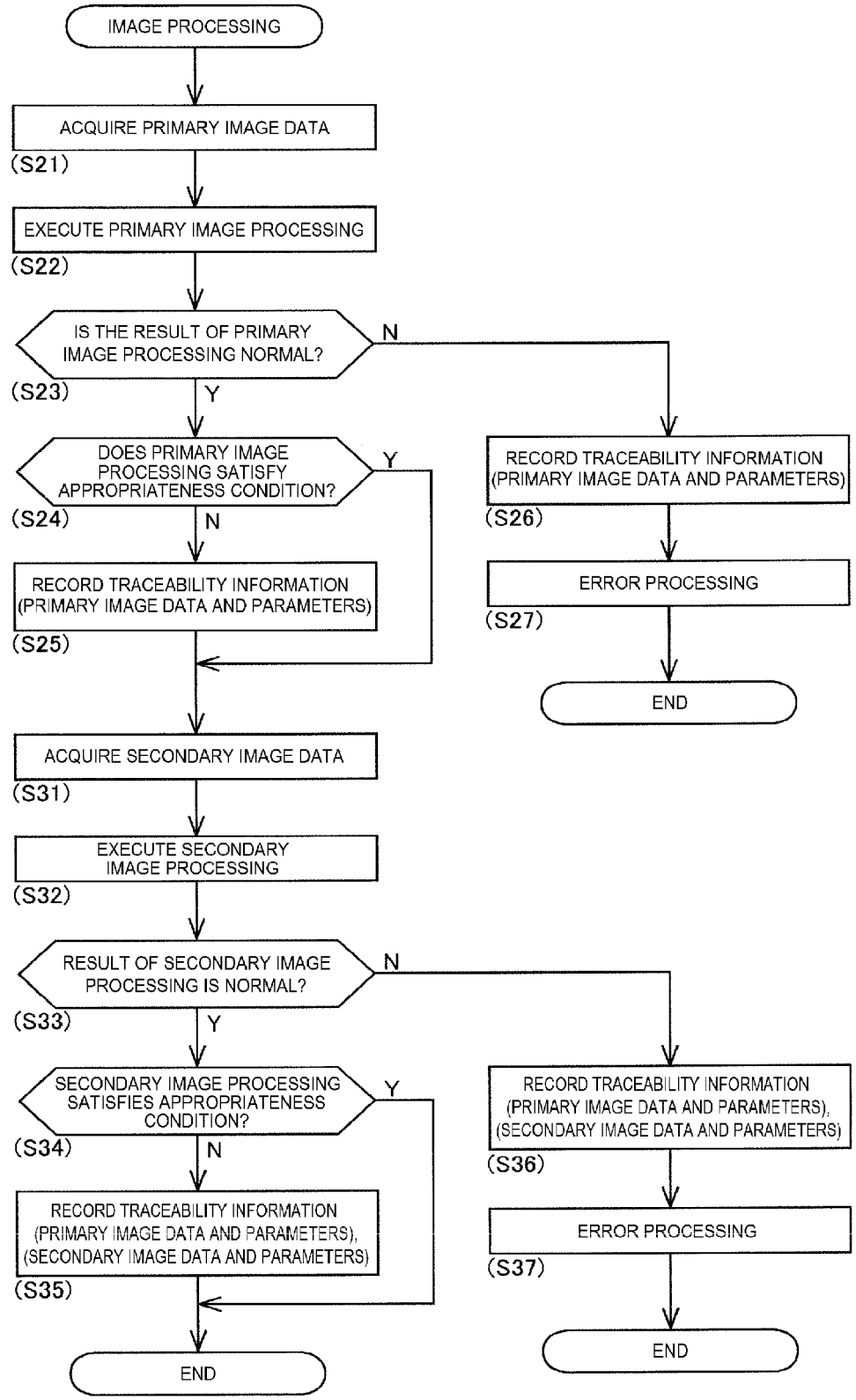
FIG. 5 is a flowchart showing an image processing.

As shown in FIG. 5, control device 70 firstly sends out an imaging command to component camera 51 to thereby acquire image data through imaging by component camera 51 (hereinafter, referred to as "primary image data") (S21). Next, control device 70 image processes the primary image data to thereby calculate a state (a coordinate value and an angle) of component P (S22). Subsequently, control device 70 determines whether the state of component P, which is the result of the primary image processing, is normal (S23).

Specifically speaking, if the coordinate value and angle of component P stay within a permissible range (refer to Table 2 in FIG. 4), control device 70 determines that the result of the primary image processing is normal (S23: Yes). In this case (S23: Yes), appropriateness determination section 81 determines whether the primary image processing satisfies the appropriateness condition indicating the reliability of the results of the primary image processing (S24). This appropriate condition is, for example, the scheduled range designated in advance by the operator, and a condition that the coordinate value at which component P is situated and the angle of component P fall within the scheduled range is set as an initial condition.

If the primary image processing does not satisfy the appropriateness condition (S24: No), information management section 82 executes the recording processing of traceability information (S25). To describe this in detail, information management section 82 records the primary image data used for the primary image processing and the parameters used for the primary image processing in association with the primary image data as traceability information. In this way, the primary image data becomes the recording target although the result of the primary image processing is determined normal, since the result does not have a certain degree of reliability.

On the other hand, if the primary image processing satisfies the appropriateness condition (S24: Yes), information management section 82 omits an execution of the recording processing of recording the primary image data as traceability information (S25), since the result has a certain degree of reliability. At this time, information management section 82 may cause the primary image data and the parameters to be temporarily stored in a storage region secured in storage section 71 as, for example, a ring buffer. In the series of processing that have been described heretofore, information management section 82 records times at which the primary processing is executed and results thereof (states of component P), as shown in Table 1 in FIG. 4.

In addition, in the normality determination on the result of the primary image processing (S23), if the coordinate value or angle of component P does not fall within the permissible range, control device 70 determines that the result of the primary image processing is abnormal (S23: No). In this case (S23: No), information management section 82 executes the recording processing of traceability information (S26). Specifically speaking, information management section 82 records the primary image data used for the primary image processing as traceability information. As this occurs, information management section 82 records the parameters used for the primary image processing in association with the primary image data as traceability information.

Then, control device 70 executes an error processing (S27). As one of the error processing, it is assumed that the operator is informed that the result of the primary image processing is determined abnormal. As a result, removal work of removing the cause for the abnormality can be prompted. In addition, as another of the error processing, in addition to the error processing described above, it is assumed that a recovery processing is executed in which the image processing is tried again or the pickup of component P is tried again.

If the result of the primary image processing is normal (S23: Yes), control device 70 shifts to the secondary image processing. Firstly, control device 70 sends out an imaging command to head camera unit 60 to thereby acquire image data through imaging by head camera unit 60 (hereinafter, referred to as "secondary image data") (S31). Next, control device 70 image processes the secondary image data and executes the inspection processing of component P (S32). Subsequently, control device 70 executes a normality determination on the result of the secondary image processing (S33), as well as an appropriateness determination thereof (S34) as required.

Since the normality determination on the result of the secondary image processing (S33) and the appropriateness determination thereof (S34) are substantially the same as the normality of the primary image processing (S23) and the appropriateness determination thereof (S24), a detailed description thereof will be omitted here. If the secondary image processing does not satisfy the appropriateness condition (S34: No), information management section 82 executes the recording processing of traceability information (S35). Specifically speaking, information management section 82 records the secondary image data and the parameters used for the secondary image processing as traceability information. At this time, irrespective of the reliability of the result of the primary image processing, which is the prior process, information management section 82 further records the primary image data and the parameters used for the primary image processing as traceability information. However, in the case that the primary image data and the parameters used for the primary image processing have already been recorded as traceability information in S25, the processing described above may be omitted since the information overlaps.

Additionally, if the result of the secondary image processing is abnormal (S33: No), information management section 82 executes the recording processing of traceability information (S36) to thereby record the secondary image data used for the secondary image processing as traceability information. At this time, information management section 82 records the parameters used for the secondary image processing in association with the secondary image data as traceability information. In addition, irrespective of the reliability of the result of the primary image processing, which is the prior process, information management section 82 further records the primary image data and the parameters used for the primary image processing as traceability information. Since an error processing (S37) in the secondary image processing is substantially the same as the error processing (S27) in the primary image processing, a detailed description thereof will be omitted here.

As described above, in the case that the image processing includes the primary image processing and the secondary image processing that are executed in series, information management section 82 records the primary image data, the secondary image data, and the like as traceability information (S25, S26, S35, S36). As a result, as shown in FIG. 6, not only in the case that the primary image data and the secondary image data are determined abnormal through the image processing normality determination (S23, S33) but also in the case that they are determined normal through the normality determination, in the event that the relevant image processing do not satisfy the corresponding appropriateness conditions (S24: No, S34: No), the primary image data and the secondary image data constitute a recording target as they are regarded as not having a certain degree of reliability.

Further, in the case that the result of the secondary image processing, which is the post process, is determined abnormal (S33) or not to satisfy the appropriateness condition (S34: No), the primary image data constitutes a recording target due to the primary image processing not satisfying the appropriateness condition, that is, due to the result of the primary image processing not having a certain degree of reliability (S35, S36). As a result, for example, in the case that the abnormality in the secondary image processing should have originally been determined abnormal in the primary image processing, the cause for the abnormality can be specified based on the recorded traceability information.

1-6. Appropriateness Condition Setting Processing

The appropriateness conditions used for the appropriateness determinations (S24, S34) in the image processing are set in accordance with the types of image processing. Specifically speaking, for example, in the case that the image processing to be executed is the state recognition processing of component P, the appropriateness condition can be set to the scheduled range of the coordinate value and angle at which component P is situated. This scheduled range may be a range that is designated in advance by the operator or that is automatically set by condition setting section 83.

Specifically speaking, condition setting section 83 may set a statistical appropriateness condition based on an average value, a median, or a most frequently occurring value in the results of the image processing executed multiple times (refer to Table 1 in FIG. 4). For example, condition setting section 83 sets a range that includes 90% of the result of an image processing that is determined normal as an appropriateness condition. As a result, in the case that the result of an image processing indicates a similar distribution in an appropriateness determination that is executed onwards, 10% of the result of the relevant image processing is determined not to have a certain degree of reliability.

In order to automatically set a statistical appropriateness condition like the one described above, the image processing needs to be executed to such an extent that a statistical value becomes significant. Then, condition setting section 83 may switch the appropriateness conditions for adoption in accordance with the significance of the statistical appropriateness condition. Specifically speaking, as shown in FIG. 7, condition setting section 83 first accepts the scheduled range designated by the operator (S41).

Next, condition setting section 83 determines whether the number of times of execution of the image processing that is determined normal reaches a specified number of times of execution (S42). This specified number of times of execution may be designated arbitrarily by the operator or the like. If the number of times of execution of the image processing does not reach the specified number of times of execution (S42: No), condition setting section 83 sets the scheduled range designated by the operator as an appropriateness condition (S43).

On the other hand, if the number of times of execution of the image processing reaches the specified number of times of execution (S42: Yes), condition setting section 83 calculates a statistical value (an average value or the like) (S44) and sets a statistical appropriateness condition based on the result of the calculation (S45). In this way, condition setting section 83 sets the appropriateness condition by switching the appropriateness condition based on the designated scheduled range and the statistical appropriateness condition in accordance with the number of times of execution of the image processing.

Additionally, after the number of times of execution of the image processing reaches the specified number of times of execution, condition setting section 83 may fix the appropriateness condition or may update the appropriateness condition every time the image processing is executed. Further, after the number of times of execution of the image processing reaches the specified number of times of execution, condition setting section 83 may, for example, present the statistical value to the operator to thereby accepts an arbitrarily designated scheduled range, According to the configuration described above, a more appropriate appropriateness condition can be set.

In addition, in the case that the image processing is the code reading processing, condition setting section 83 may set the appropriateness condition so that the appropriateness condition includes a condition that a character string recorded in the identification code has a specified character or characters or that the character string includes a specified number of characters. Here, an identification sign that the identification code records has a specified character or characters when a target object has a similar attribute or is generally indicted by a specified number of characters. Then, condition setting section 83 may be configured to set the appropriateness condition in the way described above.

Further, in the case that the identification code is the two-dimensional code, condition setting section 83 may set the appropriateness condition so that the appropriateness condition includes a condition that the number of multiple cells or the size of the two-dimensional code is a specified value or that a printing direction of the two-dimensional code is a specified direction, According to the configuration described above, whether the result of the image processing (the code reading processing) has a certain degree of reliability based on the number of cells or the size of the two-dimensional code in the appropriateness determination.

According to the configuration described above, even when the identification code is erroneously recognized to be read due to various causes, allowing the mounting process to be carried out based on the erroneous determination that the result of the image processing is normal, the image data used for the image processing (the code reading processing) becomes the recording target in the form of traceability information. As a result, the image processing constituting the cause for the recognized abnormality can be specified by tracing the mounting process. As a result, since the cause (the abnormality in reading the identification code) can be specified, the removal work of removing the cause can be prompted to thereby maintain the production efficiency.

Further, in addition to or in place of the appropriateness conditions, condition setting section 83 may set an evaluation of progress of the image processing as an appropriateness condition. The evaluation of progress of the image processing includes a required time of the image processing, the number of times of execution of a specific step included in the image processing, and the like. For example, in the image processing of detecting a position and angle at which component P is situated in the image data, since the template is scanned from an ideal position, a required time for scanning becomes longer as the position and angle lie farther away from the ideal position, and the number of times of execution of a loop processing for scanning the template becomes greater.

The appropriateness condition setting methods described above make use of the fact that in the event that a foreign matter adheres to a target object or the vicinity thereof or the target object is scratched, those foreign matter and scratches are included in acquired image data affect the progress of the image processing and the result of the image processing. In addition, in the case of the image processing being the code reading processing, multiple types of reading may be tried in order to deal with various types of identification codes, and in the event that the result of the image processing or reading processing is determined normal based on the erroneous reading, the required time may be shorter or longer than the scheduled. Then, as according to the configuration described above, the reliability of the result of the image processing can be determined by adopting the appropriateness condition requiring the required time to fall within the specified range.

1-7. Advantageous Effects of Configuration of Embodiment

Tracing device 80 of the embodiment includes appropriateness determination section 81 configured to determine whether the result of the image processing satisfies the appropriateness condition indicating the reliability of the result of the image processing when the result of the image processing executed in the production process of a board product by component mounting machine 1 stays within the permissible range where the result is determined normal and information management section 82 configured to record the image data used for the image processing as traceability information in accordance with the result of the determination made by appropriateness determination section 81.

According to the configuration described above, in the case that the result of the image processing does not have a certain degree of reliability even though the result of the image processing is determined normal, the image data used for the image processing is recorded as traceability information (S25, S35). That is, tracing device 80 targets the image data suspected of being abnormal in the image processing for recording. As a result, in the event that an image processing that is erroneously determined normal in an image processing step is detected as abnormal in a post step, the image processing causing the abnormality can be specified based on the image data recorded as the traceability information. Thus, the traceability of the production process carried out by component mounting machine can be improved.

In addition, in the embodiment, condition setting section 83 sets the statistical appropriateness condition based on the results of the image processing that is executed multiple times. According to the configuration described above, the appropriateness condition indicating what sort of result of the image processing has a certain degree of reliability can be set appropriately based on the results of the image processing executed previously. As a result, the image data used for the image processing whose result is determined to be low in reliability can be made to constitute a recording target in an ensured fashion. Further, by adopting the configuration in which the image data of the image processing whose result is determined to satisfy the appropriateness condition is not recorded (including a mode in which the recorded image data is sequentially deleted in order in which they were entered once the capacity exceeds a certain level), an excessive recording of image data more than required for the reason that the reliability of the result is low can be prevented.

In the embodiment, if appropriateness determination section 81 determines that the image processing does not satisfy the appropriateness condition (S24: No, S34: No), information management section 82 records the image data used for the image processing as traceability information (S25, S35). According to this configuration, in the case that information management section 82 is configured not to record the image data used for the image processing in the event that the relevant image processing satisfies the appropriateness condition (S24: Yes, S34: Yes) (including a mode in which the image data is temporary recorded in a ring buffer), the image data can be prevented from being recorded excessively, thereby making it possible to use the storage region of storage section 71 efficiently.

2. Modified Example of Embodiment

2-1. Appropriateness Determination Processing

In the embodiment, tracing device 80 executes the recording processing of traceability information (S25, S35) in accordance with the result of the appropriateness determination (S24, S34) of the image processing. Tracing device 80 may execute the appropriateness determination and the recording processing for all the image processes which are executed in the board work machine (component mounting machine 1) to which tracing device 80 is applied. Additionally, tracing device 80 may execute the appropriateness determination and the recording processing for part of the image processes which are executed.

Specifically speaking, tracing device 80 may be configured to execute the appropriateness determination and the recording processing based on, for example, recording target information for traceability information. The recording target information described above is information in which whether traceability information is to be recorded is associated with, for example, the image processing on which the appropriateness determination is made or a target object that is imaged in the image processing, and the information is stored in advance in storage section 71. Appropriateness determination section 81 determines whether the appropriateness determination is to be executed based on the recording target information and executes the appropriateness determination only when required.

According to the configuration described above, information management section 82 executes the traceability information recording processing in the case that the recording target information requires the appropriateness determination to be executed and that the image processing does not satisfy the appropriateness condition. As a result, only traceability information on the specific image processing or target object is accumulated. As a result, unnecessary traceability information can be prevented from being recorded, and a reduction in processing load can be realized.

For the recording target information, not only the image processing or the target object for which the appropriateness determination is executed may specifically be set, but also the necessity of execution of the appropriateness processing in accordance with the characteristics of the image processing or the target object may be set. For example, the size of the target object is set as a characteristic of the target object, and appropriateness determination section 81 determines on the necessity of execution of the appropriateness determination based on whether the size of the target object exceed a set value and executes the appropriateness determination only when required.

The characteristics of the target object may be, for example, the size, shape, or occupied area in the image data of the whole or a specific part of the target object (the board, the component, the identification code, and the like). The characteristics of the target object may be set as an appropriateness condition. Appropriateness determination section 81 may determine whether the image processing satisfies the appropriateness condition including the characteristics of the target object.

2-2. Traceability Information

In the embodiment, information management section 82 is configured to record the image data and the parameters as traceability information, if the result of the image processing is determined abnormal (S23: No, S33: No) and if the image processing does not satisfy the appropriateness condition (S24: No, S34: No).

On the other hand, provided that information management section 82 records the image data and the like described above as traceability information in such a manner as to be classified, information management section 82 may be configured to record the whole of the image data. Additionally, provided that information management section 82 records at least the image data used for the image processing as traceability information, the parameters do not necessarily have to be included in traceability information.

2-3. Tracing Device

In the embodiment, tracing device 80 is described as being incorporated in component mounting machine 1. In contrast with this, tracing device 80 may be incorporated in head camera unit 60 or the like in the case that an image processing is executed in head camera unit 60 or the like making up component mounting machine 1. In addition, tracing device 80 may be incorporated in an exterior device of component mounting machine 1, for example, in a host PC configured to supervise and control a production line that component mounting machine 1 makes up.

In the embodiment, the board work machine is described as being component mounting machine 1. In contrast with this, tracing device 80 can be applied to a board work machine other than component mounting machine 1, provided that the board work machine can execute an image processing in execution of a production process of board products. Specifically speaking, such a board work machine may be a solder printing machine and an inspection device configured to inspect a circuit board on which components are mounted, the solder printing machine and the inspection device making up a production line together with component mounting machine 1.

REFERENCE SIGNS LIST

1: Component mounting machine (Board work machine), 40: Mounting head, 51: Component camera, 52: Board camera, 60: Head camera unit, 70: Control device, 71: Storage section, 72: Mounting control section, 80: Tracing device, 81: Appropriateness determination section, 82: Information management section, 83: Condition setting section. 90: Board (Circuit board, Constituent component), P: Component (Constituent component)

The invention claimed is:

1. A tracing device comprising:
a central processing unit (CPU) configured to
determine whether an image processing, which is executed in a production process of a board product by a board work machine, satisfies an appropriateness condition indicating reliability of a result of the image processing when the result of the image processing stays within a permissible range in which the result of the image processing is determined normal; and
record image data used in the image processing as traceability information according to a result of the determination,
wherein the image processing includes a primary image processing using the image data acquired by a first camera that images a constituent component from a first direction, the constituent component making up the board product, and a secondary image processing executed for secondary image data for the same constituent component after the primary image processing, the secondary image data being acquired by a second camera that images the constituent component from a second direction that is substantially perpendicular to the first direction.

2. The tracing device according to claim 1,
wherein the image processing is a processing of recognizing a state of a constituent component making up the board product, and
wherein the appropriateness condition includes a condition that a coordinate value at which the constituent component is situated or an angle of the constituent component fall within a scheduled range.

3. The tracing device according to claim 2,
wherein the board work machine is a component mounting machine configured to produce the board product by holding a component supplied thereto using a mounting head and mounting the component on a circuit board, wherein the constituent component includes the component, and wherein the image processing is a processing of recognizing a state of the component supplied so as to be picked up in the component mounting machine or the component held by the mounting head.

4. The tracing device according to claim 2, wherein the constituent component includes a circuit board, and wherein the image processing is a processing of recognizing a state of the circuit board positioned in the board work machine or the circuit board that is being conveyed within the board work machine.

5. The tracing device according to claim 2, wherein the CPU is further configured to set the appropriateness condition which is statistical based on results of the image processing executed multiple times.

6. The tracing device according to claim 5, wherein the CPU sets the appropriateness condition which is statistical based on an average value, a median, or a most frequently occurring value in the results of the image processing.

7. The tracing device according to claim 5, wherein the CPU accepts the scheduled range designated by an operator and sets the appropriateness condition by switching between the appropriateness condition based on the designated scheduled range and the appropriateness condition which is statistical in accordance with a number of times of execution of the image processing.

8. The tracing device according to claim 1, wherein the image processing is a processing of reading an identification code affixed to a constituent component that makes up the board product.

9. The tracing device according to claim 8, wherein the appropriateness condition includes a condition that a character string recorded in the identification code has a specified character or is made up of a specified number of characters.

10. The tracing device according to claim 8, wherein the identification code is a two-dimensional code in which multiple cells are aligned, and
wherein the appropriateness condition includes a condition that a number of the multiple cells or a size of the two-dimensional code is a specified value, or a printing direction of the two-dimensional code is a specified direction.

11. The tracing device according to claim 1, wherein the appropriateness condition includes a condition that a required time of the image processing falls within a specified range.

12. The tracing device according to claim 1, wherein the CPU records the image data used for the image processing as traceability information in the event that the CPU determines that the image processing does not satisfy the appropriateness condition.

13. The tracing device according to claim 1, wherein the CPU records a parameter used for the image processing in association with the image data as the traceability information.

14. The tracing device according to claim 1,
wherein the appropriateness condition includes a condition that the secondary image processing has a predetermined degree of reliability.

* * * * *